(12) United States Patent
Fujii et al.

(10) Patent No.: US 8,414,704 B2
(45) Date of Patent: Apr. 9, 2013

(54) BONDING STRUCTURE AND SEMICONDUCTOR DEVICE MANUFACTURING APPARATUS

(75) Inventors: Tomoyuki Fujii, Nagoya (JP); Taichi Nakamura, Nagoya (JP); Hiroshi Takebayashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1129 days.

(21) Appl. No.: 12/349,682

(22) Filed: Jan. 7, 2009

(65) Prior Publication Data

US 2009/0173448 A1    Jul. 9, 2009

(30) Foreign Application Priority Data

Jan. 8, 2008   (JP) .................................. 2008-001364
Jan. 6, 2009   (JP) .................................. 2009-001191

(51) Int. Cl.
B32B 37/00   (2006.01)
C23C 16/00   (2006.01)
H01L 21/306  (2006.01)
B23B 31/28   (2006.01)

(52) U.S. Cl.
USPC ....... 118/728; 156/345.51; 279/128; 361/234

(58) Field of Classification Search ................... 118/728, 118/725; 156/345.51; 279/128; 361/233–234
See application file for complete search history.

(56) References Cited

U.S. PATENT DOCUMENTS 5,995,357 A    11/1999  Ushikoshi et al.
6,617,514 B1 *  9/2003  Ushikoshi et al. .......... 174/84 R
6,949,726 B2 *  9/2005  Kushihashi et al. .......... 219/543

FOREIGN PATENT DOCUMENTS

JP    3790000 B2    4/2006

* cited by examiner

Primary Examiner — Karla Moore
Assistant Examiner — Nathan K Ford
(74) Attorney, Agent, or Firm — Burr & Brown

(57) ABSTRACT

The present invention relates to a bonding structure, including: a ceramic member including a hole; a terminal embedded in the ceramic member, an exposed surface exposed to a bottom portion of the hole, and made of a refractory metal having a thermal expansion coefficient substantially equal to a thermal expansion coefficient of the ceramic member; a brazed bond layer including a first tantalum layer in contact with the exposed surface of the terminal, a gold layer formed on the first tantalum layer, and a second tantalum layer formed on the gold layer; and a connecting member inserted in the hole, bonded to the terminal via the brazed bond layer, and made of a refractory metal having a thermal expansion coefficient substantially equal to the thermal expansion coefficient of the ceramic member.

11 Claims, 13 Drawing Sheets

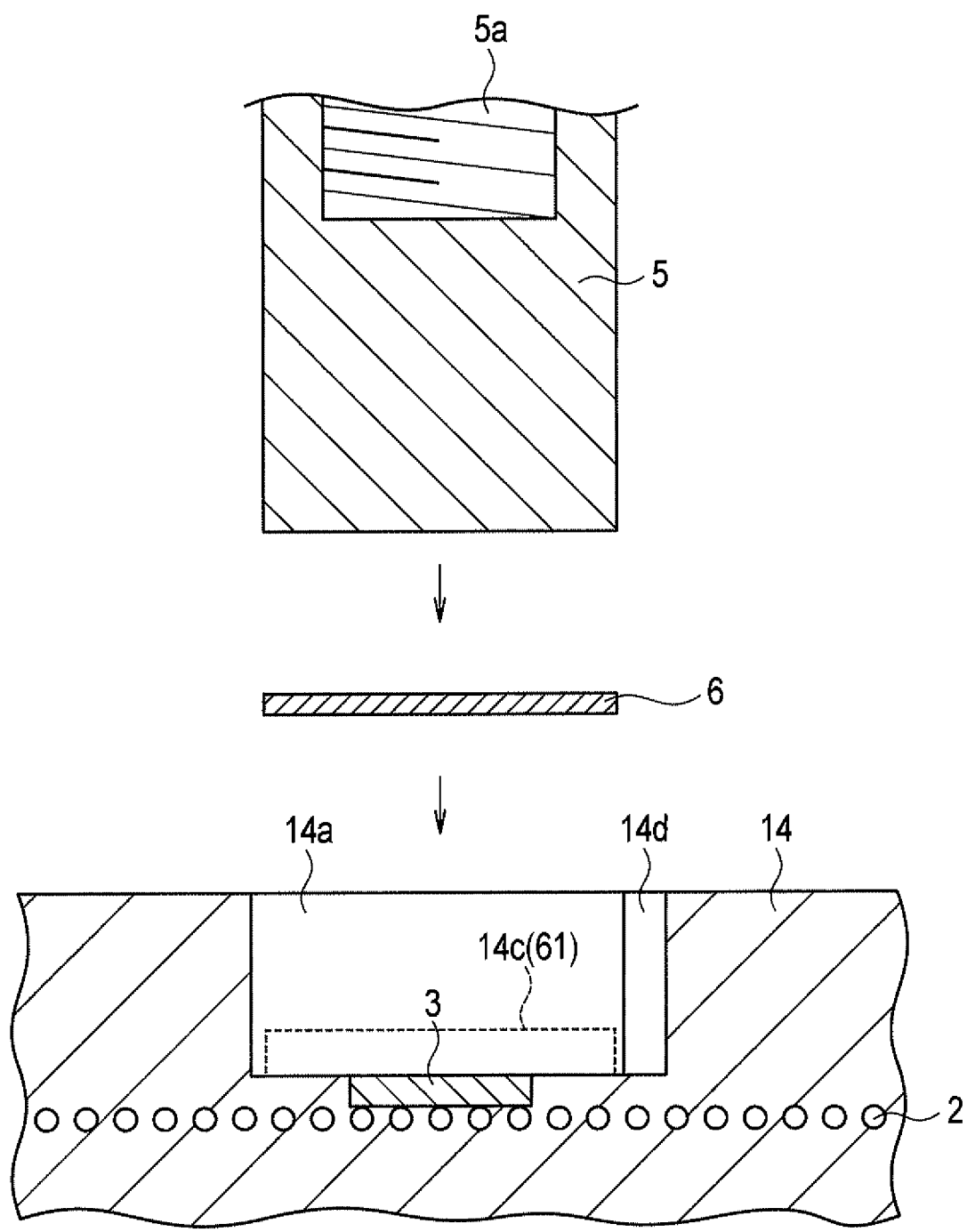

US 8,414,704 B2

BONDING STRUCTURE AND SEMICONDUCTOR DEVICE MANUFACTURING APPARATUS

This application is based upon and claims the benefit of priority from prior Japanese Patent Application No. 2008-001364, filed on Jan. 8, 2008; and Japanese Patent Application No. 2009-001191, filed on Jan. 6, 2009, the entire contents of which are incorporated herein by reference.

BACKGROUND OF THE INVENTION

1. Field of the Invention

The present invention relates to bonding structures and semiconductor device manufacturing apparatuses. More specifically, the present invention relates to a bonding structure for bonding a connecting member to a metal terminal embedded in a ceramic member, a bonding structure including a connecting member for supplying an electric power to an electrode embedded in a ceramic member, and a semiconductor device manufacturing apparatus having this bonding structure.

2. Description of the Related Art

Semiconductor wafer susceptors such as an electrostatic chuck in which an electrode is embedded in a ceramic member are used in the field of semiconductor device manufacturing apparatuses such as an etching apparatus, a CVD apparatus or the like. Examples of the semiconductor wafer susceptors include: a semiconductor wafer susceptor in which an electrode is embedded in a base material such as aluminum nitride or dense alumina, and is configured to function as a discharge electrode for generating plasma; a semiconductor wafer susceptor which includes metal resistors (heater) embedded in a base material such as aluminum nitride or alumina, and is configured to function as a ceramic heater for controlling the temperature of a wafer in a heat treatment processing such as CVD, or the like. In addition, some semiconductor wafer susceptors include electrodes are embedded in the base materials of and function as electrostatic chucks configured to chuck and hold semiconductor wafers in the process of wafer transfer an exposure, a film forming such as CVD and sputtering, a micro-processing, a cleansing, an etching, a dicing, and the like.

In these apparatuses, an electrode embedded in the ceramic base material such as aluminum nitride needs to be electrically connected to a connecting member. The portion connecting the electrode and the connecting member is subjected to heat cycles of extremely high and low temperatures in an oxidizing atmosphere and further in a corrosive gas atmosphere. Even in such severe conditions, the portion connecting the electrode and the connecting member is required to maintain a high bonding strength and a suitable electrical connection for a long period of time.

In order to solve these problems, some techniques have been proposed (see Japanese Patent Publication No. 3790000, for example). Nevertheless, problems remain yet to be solved in these proposed techniques.

For example, when an electrode connecting part is produced for a semiconductor wafer susceptor as a semiconductor device manufacturing apparatus, a connecting member and a terminal embedded in a ceramic member are bonded together with a brazed bond layer interposed in between. In general, an Au (gold)-Ni (nickel) brazed Alloy is used for the brazed bond layer. However, when the connecting member and/or the terminal embedded in the ceramic member are made of molybdenum (Mo), an intermetallic compound is produced between Mo and Ni after bonding the connecting member and the terminal via the brazed bond layer. This brings about a problem that the bonded portion is vulnerable and tends to break.

In order to solve this problem, a thicker brazed bond layer (whose thickness is stably 200 µm or more) is used, or a chromium (Cr) film is formed to prevent diffusion of Ni. However, the problems have not been solved completely.

Accordingly, a reliable bonding structure for bonding the connecting member and the terminal embedded in the ceramic member, a semiconductor device manufacturing apparatus including this bonding structure, and a semiconductor wafer susceptor including this bonding structure have been awaited.

Moreover, for the purpose of fixedly bonding a ceramic member with another part that contacts the ceramic member, some conventional apparatuses include a seating hole in the ceramic member, and a molybdenum metal member formed with a female screw is subjected to an aluminum (Al) brazing. However, since the melting point of brazed Al is low, the boding strength decreases at a temperature of 400° C. or higher. Thus, such bonding structure cannot be used at such high temperature.

SUMMARY OF THE INVENTION

A first aspect of the present invention is summarized as a bonding structure, including: a ceramic member including a hole; a terminal embedded in the ceramic member, including an exposed surface exposed to a bottom portion of the hole, and made of a refractory metal having a thermal expansion coefficient substantially equal to a thermal expansion coefficient of the ceramic member; a brazed bond layer including a first tantalum layer in contact with the exposed surface of the terminal, a gold layer formed on the first tantalum layer, and a second tantalum layer formed on the gold layer; and a connecting member inserted in the hole, bonded to the terminal via the brazed bond layer, and made of a refractory metal having a thermal expansion coefficient substantially equal to the thermal expansion coefficient of the ceramic member.

BRIEF DESCRIPTION OF THE DRAWINGS

FIG. 10 shows a process of manufacturing the semiconductor wafer susceptor according to the second embodiment.

DETAILED DESCRIPTION OF THE INVENTION

Figure 1A:
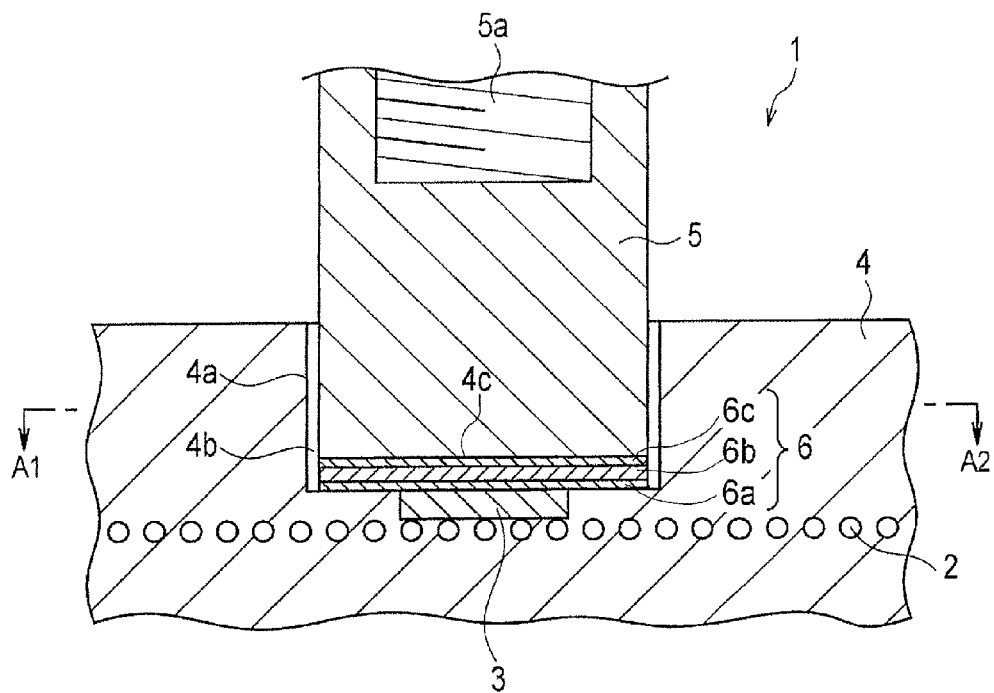
FIG. 1A is a schematic, cross-sectional view of a semiconductor wafer susceptor according to the first embodiment, which is vertical to a main surface of a ceramic member included in the semiconductor wafer susceptor.

Descriptions will be provided hereinafter for the present invention by citing the embodiments of the present invention. Note that the present invention is not limited to the following embodiments. Throughout the drawings, components having the same or similar functions will be denoted by the same or similar reference numerals, and descriptions thereof will be omitted.

First Embodiment

Semiconductor Wafer Susceptor (Bonding Structure)

Figure 1B:
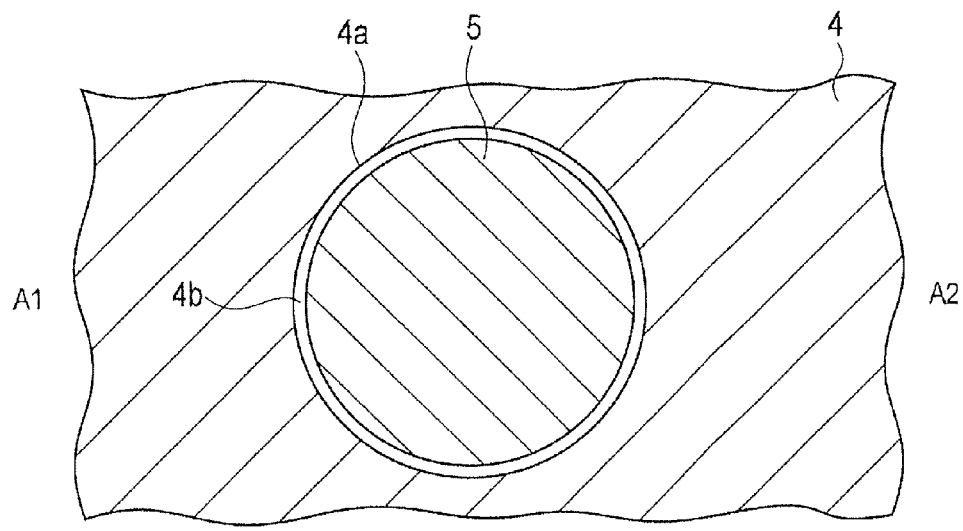
FIG. 1B is a schematic, cross-sectional view of the semiconductor wafer susceptor according to the embodiment, which is parallel with the main surface of the ceramic member included in the semiconductor wafer susceptor.

FIG. 1A is a schematic, cross-sectional view of a semiconductor wafer susceptor according to the first embodiment, which is vertical to a main surface of a ceramic member included in the semiconductor wafer susceptor. FIG. 1B is a schematic, cross-sectional view of the semiconductor wafer susceptor, according to the first embodiment, which is parallel with a main surface of a ceramic member included in the semiconductor wafer susceptor, according to the first embodiment. Note that the descriptions for the semiconductor wafer susceptor according to the first embodiment constitute descriptions for a bonding structure and a semiconductor device manufacturing apparatus including the bonding structure.

The semiconductor wafer susceptor according to the first embodiment includes: a ceramic member 4, a terminal 3, a brazed bond layer 6, and a connecting member 5. The ceramic member 4 includes a hole 4a on its upper surface. As a conductive layer, heater resistors 2 are embedded inside the ceramic member 4. The ceramic member 4 includes the heater resistors 2 embedded therein, as a conductive layer. The terminal 3 includes a first main surface exposed to the bottom portion of the hole 4a, a second main surface electrically connected to the heater resistors 2. The terminal 3 is made of a refractory metal having a thermal expansion coefficient substantially equal to a thermal expansion coefficient of the ceramic member 4. The brazed bond layer includes three layers including a first tantalum layer 6a that contacts with the first main surface of the terminal 3, a gold (Au) layer 6b formed on the first tantalum layer 6a, and a second tantalum layer 6c formed on the gold (Au) layer 6b. The connecting member 5 is inserted in the hole 4a, and is thus bonded to the terminal 3 via the brazed bond layer 6 interposed in between. The connecting member 5 is made of a refractory metal having a thermal expansion coefficient substantially equal to a thermal expansion coefficient of the ceramic member 4. The heater resistors 2 configure conductive layer and are embedded in the ceramic member 4 in parallel with the main surface of the ceramic member 4. The inner diameter of the hole 4a is larger than the outer diameter of the connecting member 5. A clearance 4b is formed between the surface of the hole 4a and the outer surface of the connecting member 5. Accordingly, the connecting member 5 can be inserted in the hole 4a. Further, the connecting member 5 inserted in the hole 4a can thermally expand. The clearance 4b may be formed on the whole circumference of the connecting member 5. Alternatively, a part of the connecting member 5 may be in contact with the surface of the hole 4b. Actually, the clearance 4b is formed in at least any part around the connecting member 5.

Figure 3A:
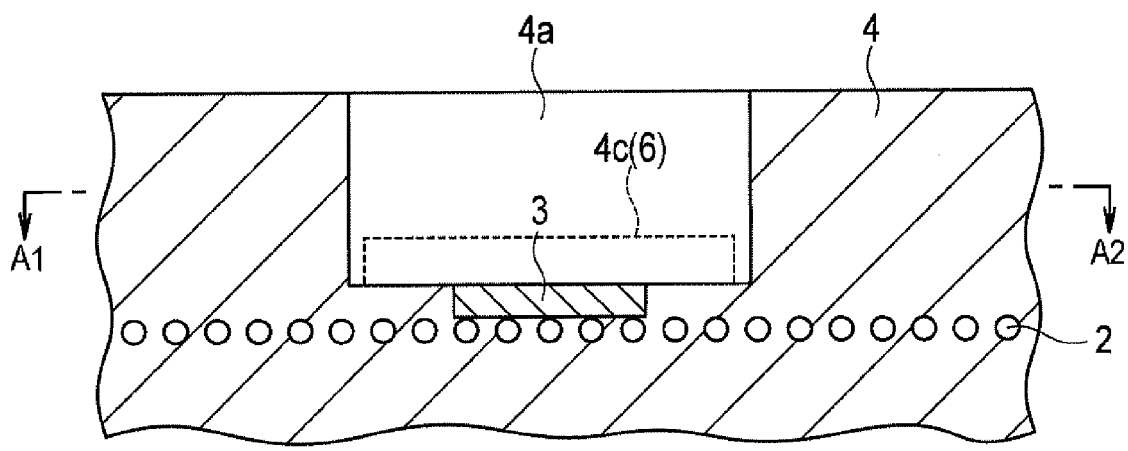
FIGS. 3A and 3B show processes of manufacturing the semiconductor wafer susceptor according to the first embodiment.
Figure 4:
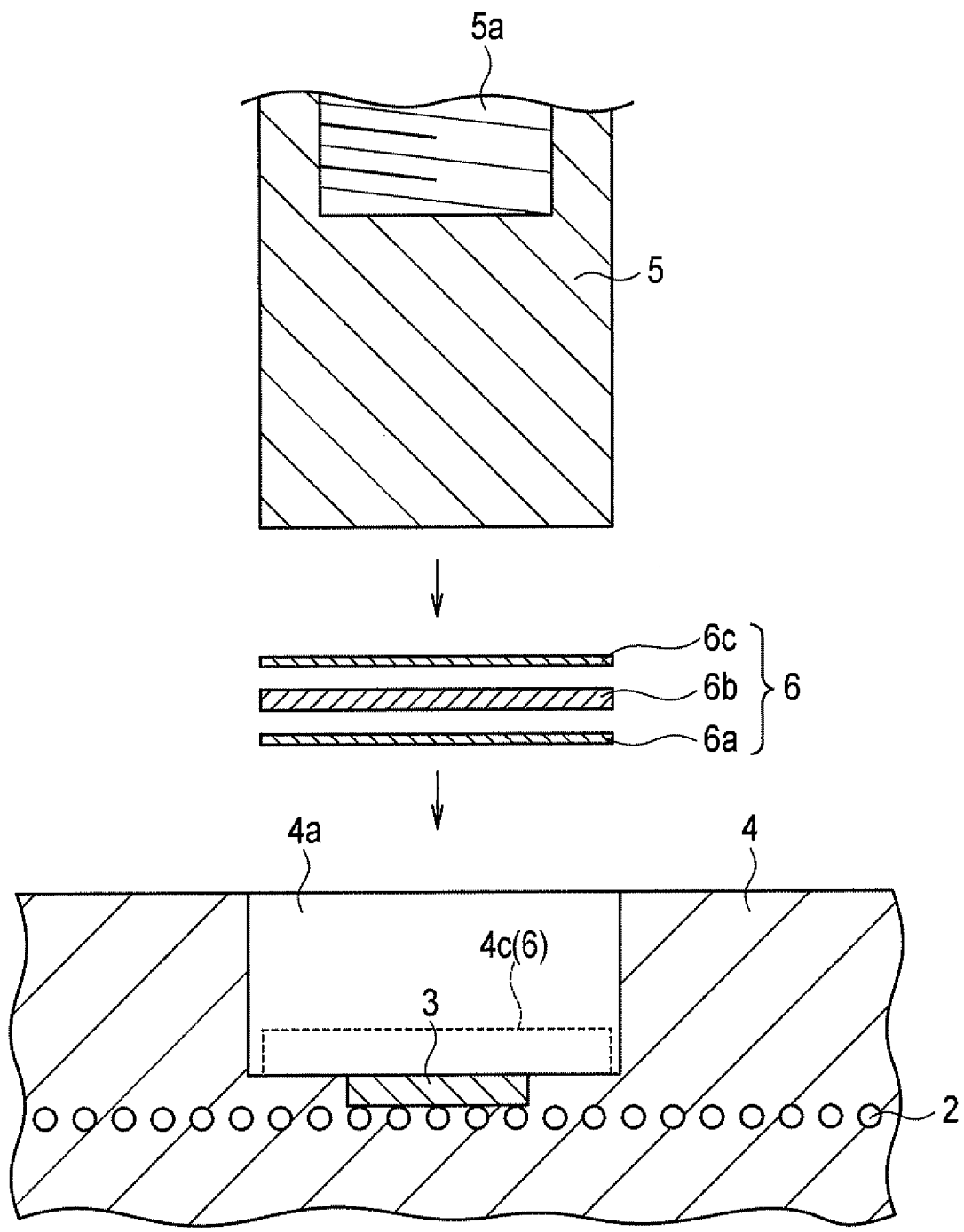
FIG. 4 shows a process of manufacturing the semiconductor wafer susceptor according to the first embodiment.

As shown in FIGS. 3A and 4, a first space 4c is formed between the main surface of the end portion of the connecting member 5 and the bottom surface of the hole 4a that includes the first main surface (exposed surface) of the terminal 3. The first space 4c is partially filled with a braze material that constitutes a part of the brazed bond layer 6. The first space 4c has a substantially semicircular shape while having an upper surface (bottom surface) of the main surface of the end portion of the connecting member 5.

A spiral groove 5a is formed in the connecting member 5. An end of the electrode having a corresponding spiral groove is screwed into the groove 5a, although the illustration of the electrode is omitted for easy understanding of the present invention. In this respect, the electrode is provided for supplying the electric power to the susceptor 1.

As for the clearance 4b, it is preferable that the clearance 4b should be wider than 0 mm, and approximately 0.5 mm, when the outer diameter of the connecting member 5 is set at 4 mm to 6 mm. When the clearance 4b is narrower than the lower limit, the connecting member 5 cannot be inserted in the hole 4a, and thereby making the processes of producing the susceptor 1 difficult. On the contrary, when the diameter of the hole 4a is too large, impurities tend to enter the clearance 4b, and thereby causing a contamination or electrode corrosion. A hole 4a larger than necessary need not be formed in the ceramic member, since the strength of the ceramic member 4 decreases as the hole 4a formed in the ceramic member 4 becomes larger in size. In addition, the clearance 4b is expected to play a function of guiding the insertion of the connecting member 5 into the hole 4a.

The material for the ceramic member 4 is not specifically limited. Examples of the material for the ceramic member 4 include alumina, aluminum nitride (AlN), trisilicon tetranitride ($Si_3N_4$) and boron nitride (BN). These compounds can be formed into a desired shape by sintering or the like.

With regard to the material for the terminal 3, it is preferable that the terminal 3 should be formed of a refractory metal having a thermal expansion coefficient substantially equal to the thermal expansion coefficient of the ceramic member 4. This is because the material for the terminal 3 is sintered together with a ceramic powder such as alumina powder or aluminum nitride powder, which is the material for the ceramic member 4, when the ceramic member 4 is manufactured. It is desirable to use a combination of alumina with any one of niobium and titanium, a combination of aluminum nitride with any one of molybdenum and platinum, or a combination of a combination of $Si_3N_4$ or boron nitride (BN) and tungsten. Although the material for the terminal 3 is not limited to these combinations, use of the combination of aluminum nitride with molybdenum is particularly desirable. When aluminum nitride ceramics is used as the material for the ceramic member 4, molybdenum is preferably used. This is because the molybdenum has a thermal expansion coefficient substantially equal to the thermal expansion coefficient of the aluminum nitride ceramics, and molybdenum can be used as a bulk body which is capable of being embedded in the ceramic member 4, but which is large to a certain extent, when the aluminum nitride ceramics is sintered at a high melting point.

With regard to the material for the connecting member 5, it is preferable that the connecting member should be formed of a metal having a thermal expansion coefficient equal to the thermal expansion coefficient of the material for the terminal 3. This is because, while the connecting member 5 and the ceramic member 4 are directly brazed to each other, a difference in the thermal expansion of the materials tends to decrease the bonding strength between the connecting member 5 and the terminal 3.

When the same material is used for both the connecting member 5 and the terminal 3, the difference in the stress is eliminated between the connecting member 5 and the terminal 3, and therefore the stress applied to the ceramic member 4 can be moderated. From these viewpoints, it is particularly desirable to use molybdenum as the materials respectively for the connecting member 5 and the terminal 3 when the ceramic member 4 is formed of aluminum nitride. Aluminum nitride is an insulating material that is highly heat-conductive and has a high strength. For this reason, aluminum nitride is the most suitable material to be used for the semiconductor wafer susceptor 11.

The diameter of the brazed bond layer 6 should preferably be set substantially equal to the diameter of the connecting member 5. With regard to the thickness of the brazed bond layer 6, the thickness of the gold (Au) layer 6b should preferably be set at more than 0.05 mm but less than 0.3 mm, when the diameter of the brazed bond layer 6 is set at not less than 4 mm but not more than 6 mm, and concurrently when the thicknesses respectively of the first tantalum layer 6a and the second tantalum layer 6c are set at 0.01 mm. That is because, when the thickness of the gold (Au) layer 6b is not included in the foregoing range, the bonding strength decreases. In addition, when the diameter of the brazed bond layer 6 is set at not less than 4 mm but not more than 6 mm, and concurrently when the thickness of the gold (Au) layer 6b is set at 0.15 mm, the thicknesses respectively of the first tantalum layer 6a and the second tantalum layer 6c should preferably be set at not less than 0.01 mm but less than 0.07 mm. That is because, when the thicknesses respectively of the first tantalum layer 6a and the second tantalum layer 6c are not included the foregoing range, the bonding strength decrease.

Although the brazed bond layer 6 is configured of three layers including the first tantalum layer 6a and the second tantalum layer 6c with the gold layer 6b interposed in between, the first tantalum layer 6a and the second tantalum layer 6c are not required to be different, and the purities of these two tantalum layers are substantially equal to each other.

The materials for the heater resistors 2 are not specifically limited. However, a sheet-shaped metal bulk material should preferably be used. An example of the sheet-shaped metal bulk material is a metal formed into a single sheet. Other examples of the sheet-shaped metal bulk material include a bulk material made of a plate-shaped body having many pores (a perforated metal), and a bulk material made of a mesh-shaped body.

In the semiconductor wafer susceptor 1 including the bonding structure according to first embodiment, the brazed bond layer does not contain nickel (Ni). Accordingly, intermetallic compound is not produced between the connecting member 5 and the terminal 3. As a result, the semiconductor wafer susceptor 1 can enhance the durability against external forces generated by heat cycles, handlings and the like. In addition, the brazed bond layer 6 is formed by including the two tantalum (Ta) layers with the gold (Au) layer interposed in between, the solid solution layer but not a vulnerable intermetallic compound is formed in the semiconductor wafer susceptor 1. Accordingly, this solid solution layer functions as a buffer layer when the external forces are applied to the semiconductor wafer susceptor 11.

Figure 15A:
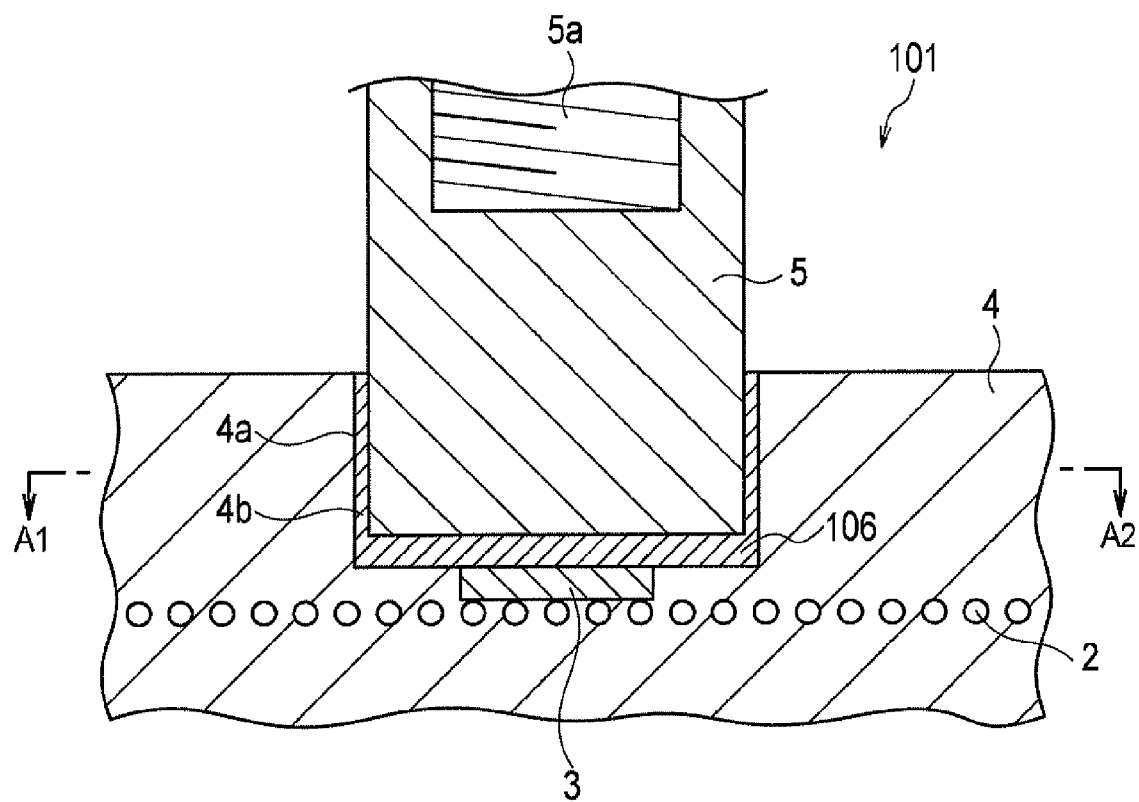
FIG. 15A is a schematic, cross-sectional view of a semiconductor wafer susceptor not including a clearance, which is vertical to a main surface of a ceramic member included in the semiconductor wafer susceptor.
Figure 15B:
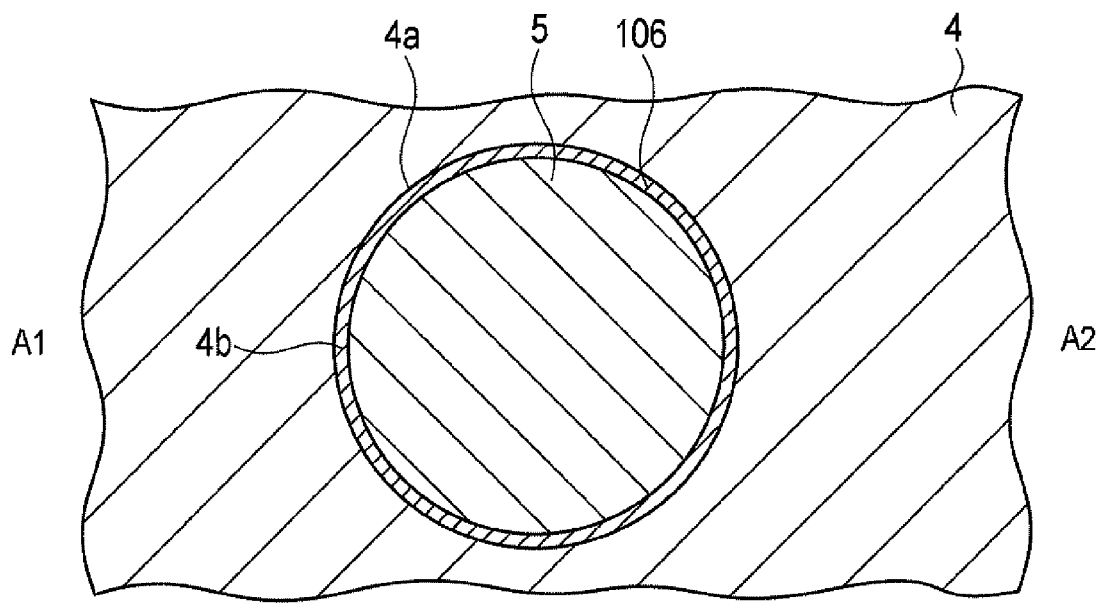
FIG. 15B is a schematic, cross-sectional view of the semiconductor wafer susceptor not including a clearance, which is parallel with the main surface of the ceramic member included in the semiconductor wafer susceptor.

Here, with reference to FIGS. 15A and 15B, considered is a case where a semiconductor wafer susceptor 101 includes a brazed bond layer 106 that fills the hole 4a in the ceramic member 4 except for a space occupied by the connecting member 5. In the semiconductor wafer susceptor 101, the connecting member 5 is fixedly attached to the ceramic member 4 while not including a clearance interposed in between. Accordingly, the heat cycles in the manufacturing or use of the semiconductor wafer susceptor 101 causes the stress between the connecting member 5 and the ceramic member 4, since the thermal expansion coefficients are different between the connecting member 5 and the ceramic member 4. As a result, the ceramic member 4 surrounding the connecting member 5 tends to break.

On the other hand, according to first embodiment, the semiconductor wafer susceptor 1 includes the clearance 4b. Even when the connecting member 5 thermally expands, the clearance 4b hardly causes the thermal stress. Consequently, the ceramic member 4 does not break. Note that it is desirable that a semiconductor wafer susceptor should have a configuration according to the second embodiment to be described later, if the semiconductor wafer susceptor need to have a higher torsional breaking strength than the semiconductor wafer susceptor 1 according to the first embodiment.

(Method of Manufacturing a Semiconductor Wafer Susceptor (Bonding Structure))

Figure 2:
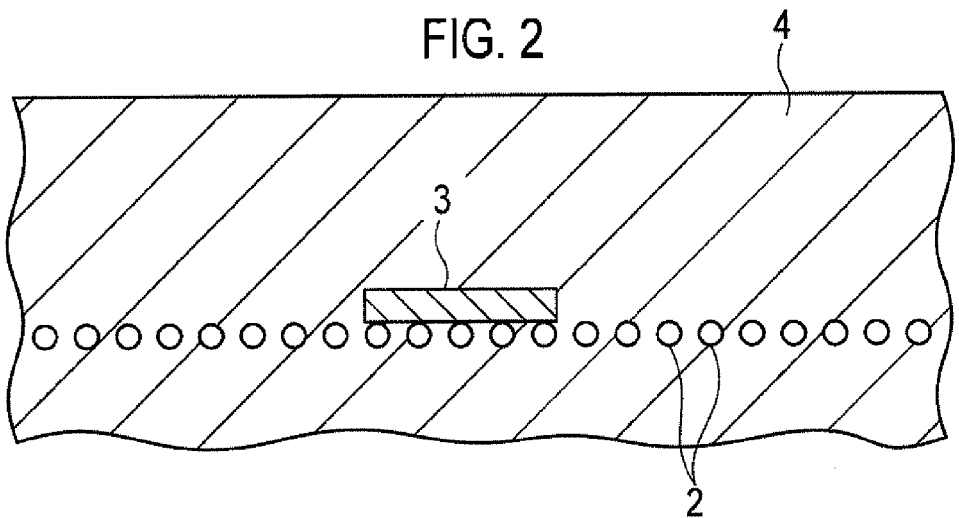
FIG. 2 shows a process of manufacturing the semiconductor wafer susceptor according to the first embodiment.

(1) As shown in FIG. 2, the ceramic member 4 is prepared in which the heater resistors 2 are embedded in parallel with the main surface of the ceramic member 4, and in which the terminal 3 is embedded so that the terminal 3 electrically contacts the heater resistors 2.

Figure 3B:
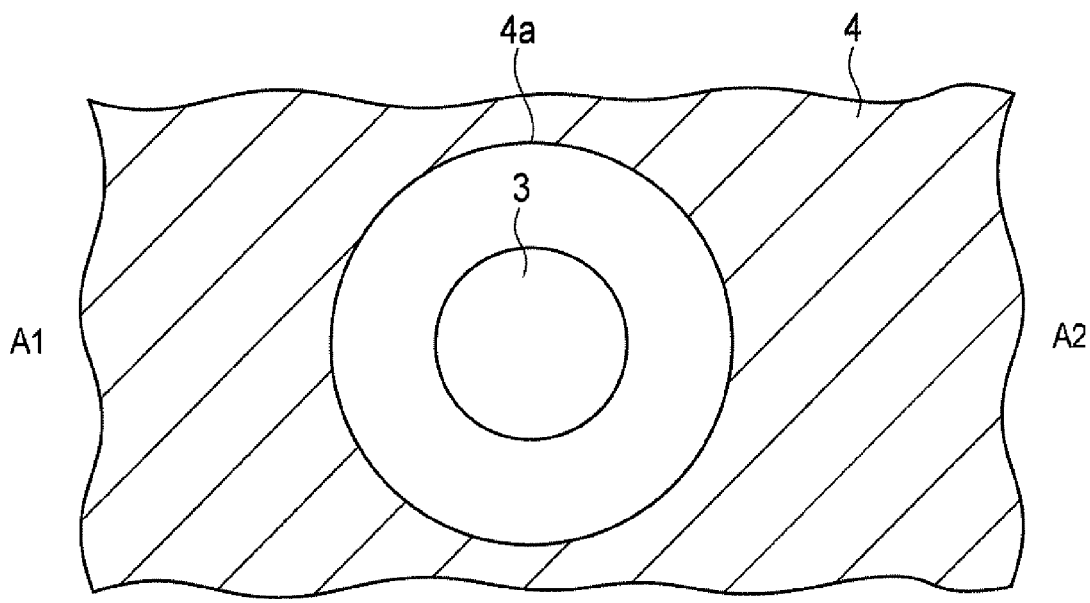

(2) As shown in FIGS. 3A and 3B, the hole 4a whose inner diameter is larger than the outer diameter of the connecting member 5 is formed in the ceramic member 4. Note that the first space 4c(6) indicated with an imaginary line in FIG. 3A is to be filled with the braze material constituting the brazed bond layer 6.

(3) As shown in FIG. 4, the brazed bond layer 6 made of the three layers including the first tantalum layer 6a, the gold layer 6b and the second tantalum layer 6c is arranged to be in contact with the first main surface (exposed surface) of the terminal 3. In this respect, the gold layer 6 is placed on the first tantalum layer 6a, and the second tantalum layer 6c is placed on the gold layer 6b. Subsequently, the connecting member 5 is arranged in the hole 4a included in the ceramic member 4 while the brazed bond layer 6 is interposed between the connecting member 5 and the bottom of the hole 4a. The first space 4c, which is defined between the connecting member 5 and the base of the hole 4a including the first main surface of the terminal 3, is filled with the braze material constituting brazed bond layer 6. Thereafter, the brazed bond layer 6 thus formed is heated and thus melted. With regard to the heating temperature, it is desirable that the brazed bond layer 6 should be heated to a temperature approximately 20° C. higher than the melting point of gold. The brazed bond layer 6 is left heated at the temperature for approximately 5 minutes. Afterward, the heating process is terminated, and the brazed bond layer 6 is left to be cooled down naturally. Thereby, the connecting member 5 is bonded to the terminal 3 with the brazed bond layer 6 interposed in between. Through these steps, the semiconductor wafer susceptor 1 shown in FIGS. 1A and 1B is produced.

Second Embodiment

Semiconductor Wafer Susceptor (Bonding Structure)

Descriptions will be provided for a semiconductor wafer susceptor according to the second embodiment, focusing mainly on the difference between the semiconductor wafer susceptor 11 according to the second embodiment and the semiconductor wafer susceptor 1 according to the first embodiment.

Figure 5A:
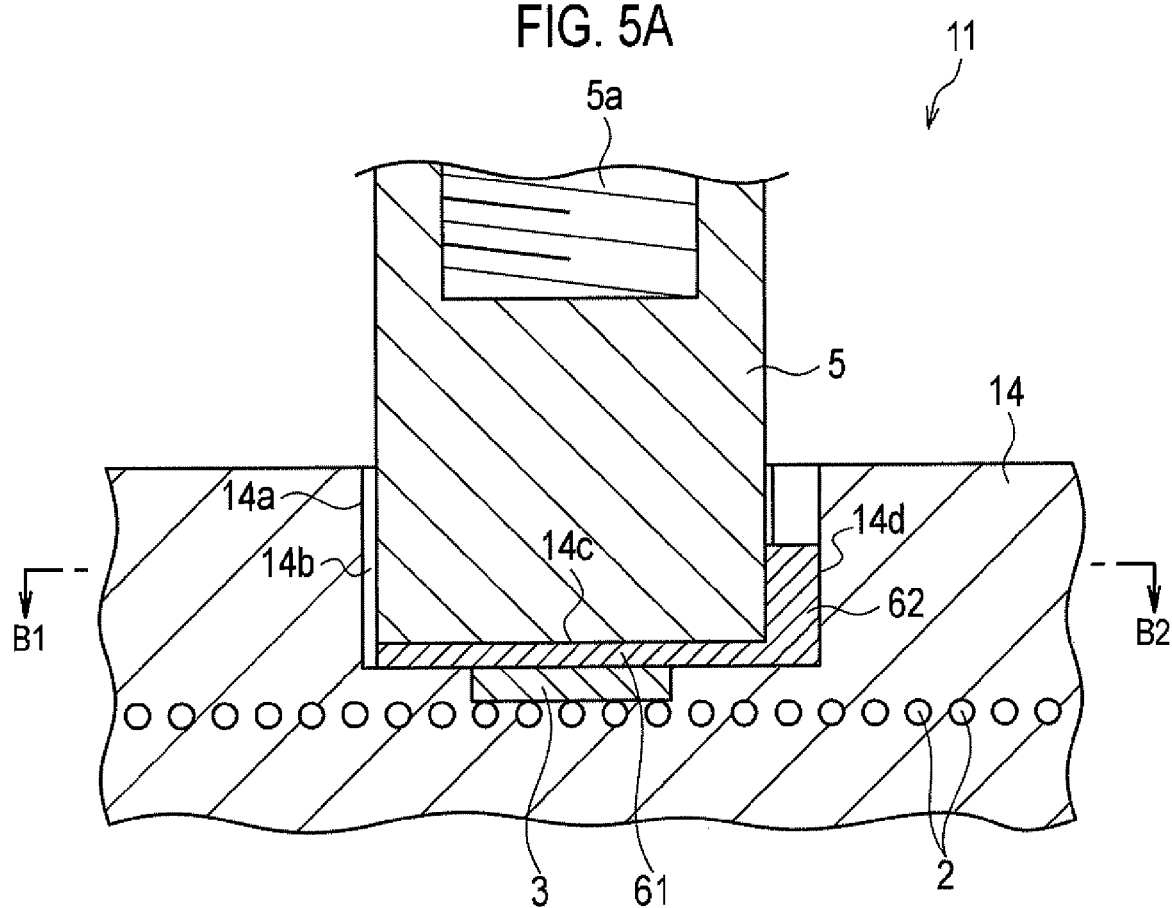
FIG. 5A is a schematic, cross-sectional view of a semiconductor wafer susceptor according to the second embodiment, which is vertical to a main surface of a ceramic member included in the semiconductor wafer susceptor.
Figure 5B:
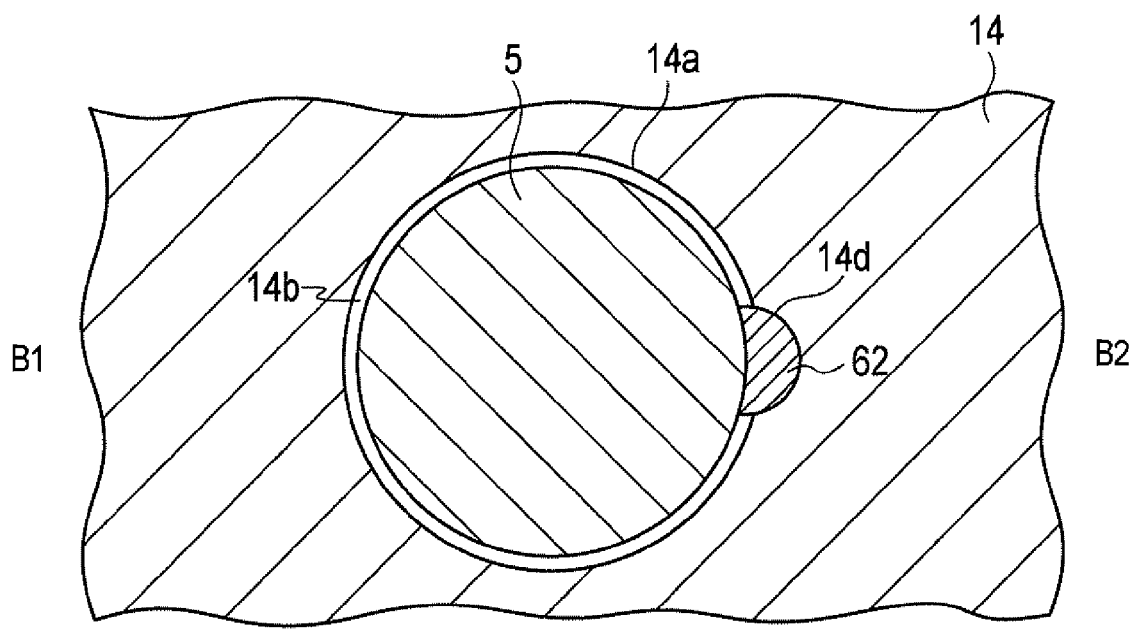
FIG. 5B is a schematic, cross-sectional view of the semiconductor wafer susceptor according to the second embodiment, which is parallel with the main surface of the ceramic member included in the semiconductor wafer susceptor.

The semiconductor wafer susceptor 11 according to the second embodiment shown in FIG. 5A has a configuration in which a braze pool space 14d is formed in a part of the surface of the hole 14a in the ceramic member 14, as shown in FIG. 5A. The braze pool space 14d is partially filled with the braze material 62. As shown in FIG. 5B, the braze pool space 14d has a substantially semicircular shape in a cross-sectional plane parallel with a main surface of the ceramic member 14.

The semiconductor wafer susceptor 11 according to the second embodiment has the braze pool space 14d in a part of the clearance 14b. Thus, the braze material 62 and the braze pool space play a role as a lock (hereinafter referred to as a "locking effect"). For this reason, when compared with any other semiconductor wafer susceptor not including braze pool space 14d, the semiconductor wafer susceptor according to the embodiment has a far higher torsional breaking strength against a torsion force to the ceramic member 14 surrounding the connecting member 5, the torsion force applied around the axis of the connecting member 5.

In the second embodiment, only the part of the clearance 14b is filled with the braze material 62. Accordingly, the connecting member 5 and the ceramic member 14 are fixedly attached to each other only in the part of the surface of the hole 14a, while the clearance 14b is formed in most part of the space between the connecting member 5 and the ceramic member 14. Consequently, the ceramic member 14 according to the second embodiment does not break unlike the ceramic member 101 as shown in FIGS. 15A and 15B, in which all of the clearance 4b are filled with the braze material constituting the brazed bond layer 106. In other words, the semiconductor wafer susceptor 11 according to the second embodiment has a far higher torsional breaking strength than the semiconductor wafer susceptor 1 according to the first embodiment in which the connecting member 5 having the same cross-sectional shape as the hole 4a is inserted in the hole 4a.

In the first embodiment, the clearance 4b is produced between the surface of the hole 4a and the connecting member 5, when the connecting member 5 having the same cross-sectional form as the hole 4a is inserted in the hole 4a. As described in the first embodiment, when the connecting member 5 having the same cross-sectional form as the hole 4a is inserted in the hole 4a, the clearance 4b is produced between the hole 4a and the connecting member 5. Some of the connecting members 5 are formed while contacting with a part of the surface of the hole 4a. However, the clearance 4b always exists somewhere between the surface of the hole 4a and the connecting member 5 depending on which direction the connecting member 5 may be twisted. Accordingly, when the connecting member 5 is twisted in a reverse direction, the ceramic member 4 tends to break. On the contrary, in the second embodiment, the braze material 62 is filled in the braze pool space 14 having a substantially semicircular shape, so that the clearance 14b is not formed in the braze pool space 14d even when a screw attached to the groove 5a formed in the connecting member 5 is tightened or loosened in both directions of twisting. Thus, the braze material 62 exerts the higher torsional breaking strength as its locking effect.

The braze pool space 14d may be formed singularly in a location of the surface of the hole 4a, or multiple braze pool spaces 14d may be formed respectively in multiple locations thereof. This is because, when paired two or four braze pool spaces 14d are located symmetrically to each other, for example, the torsional breaking strength of the multiple braze pool spaces 14d becomes higher. However, it is undesirable to provide five or more braze pool spaces 14d in the respective locations of the surface of the hole 4a. This is because the larger number of braze pool spaces 14d require larger amount of braze material, and increase probability of breakage in the ceramics. Above all, it is desirable that one or two pairs of braze pool spaces 14d should be formed in the respective mutually-opposed locations in the surface of the hole 14a. It is most desirable that one pair of braze pool spaces 14d should be formed in the respective mutually-opposed locations on the surface of the hole 14a.

(Method of Manufacturing a Semiconductor Wafer Susceptor)

Descriptions will be provided for a method of manufacturing a semiconductor wafer susceptor according to the second embodiment, focusing mainly on the differences from the method of manufacturing a semiconductor wafer susceptor according to first embodiment.

Figure 6:
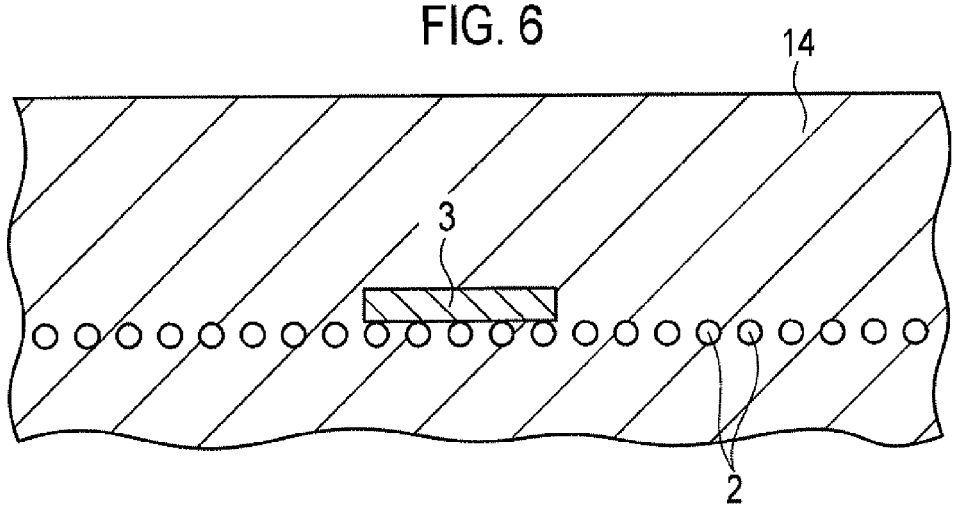
FIG. 6 shows a process of manufacturing the semiconductor wafer susceptor according to the second embodiment.
Figure 7A:
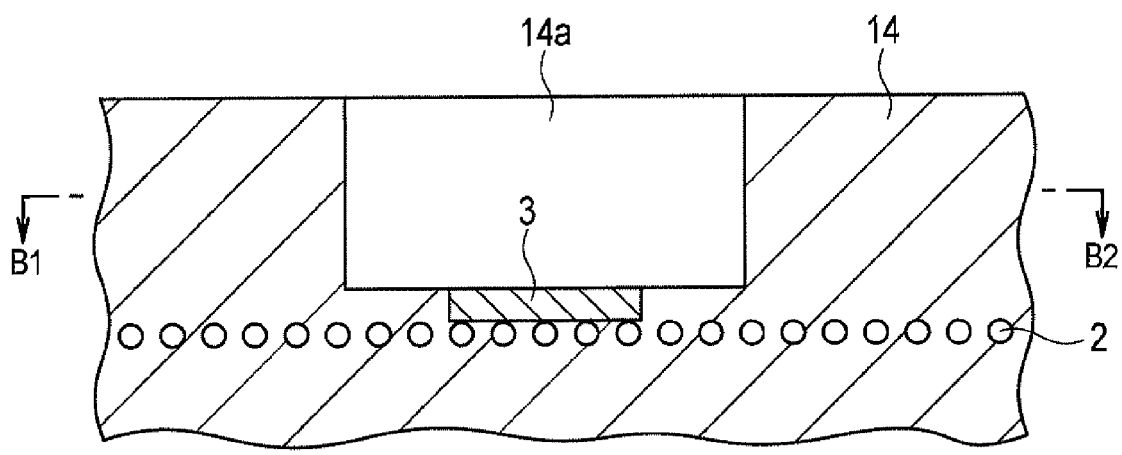
FIGS. 7A and 7B shows a process of manufacturing the semiconductor wafer susceptor according to the second embodiment.
Figure 7B:
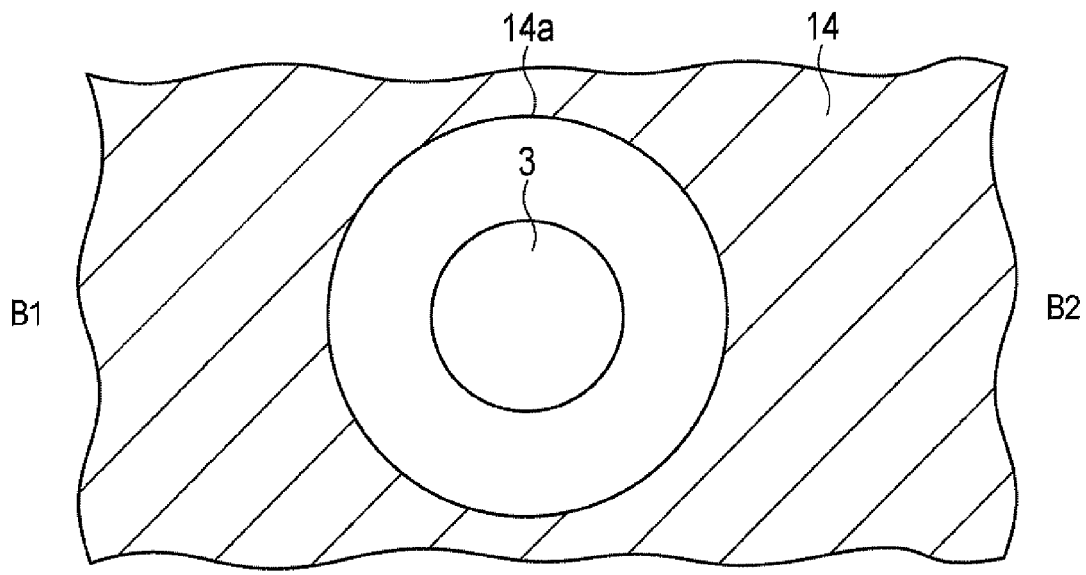

(1) As shown in FIGS. 6, 7A and 7B, the ceramic member 14 is processed through steps similar to those shown in FIGS. 2, 3A and 3B.

Figure 8A:
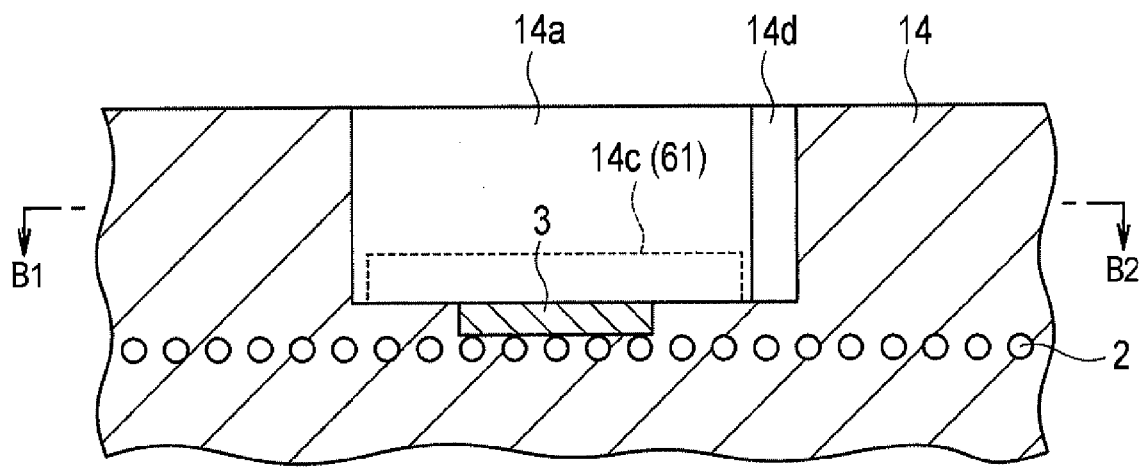
FIGS. 8A and 8B shows a process of manufacturing the semiconductor wafer susceptor according to the second embodiment.
Figure 8B:
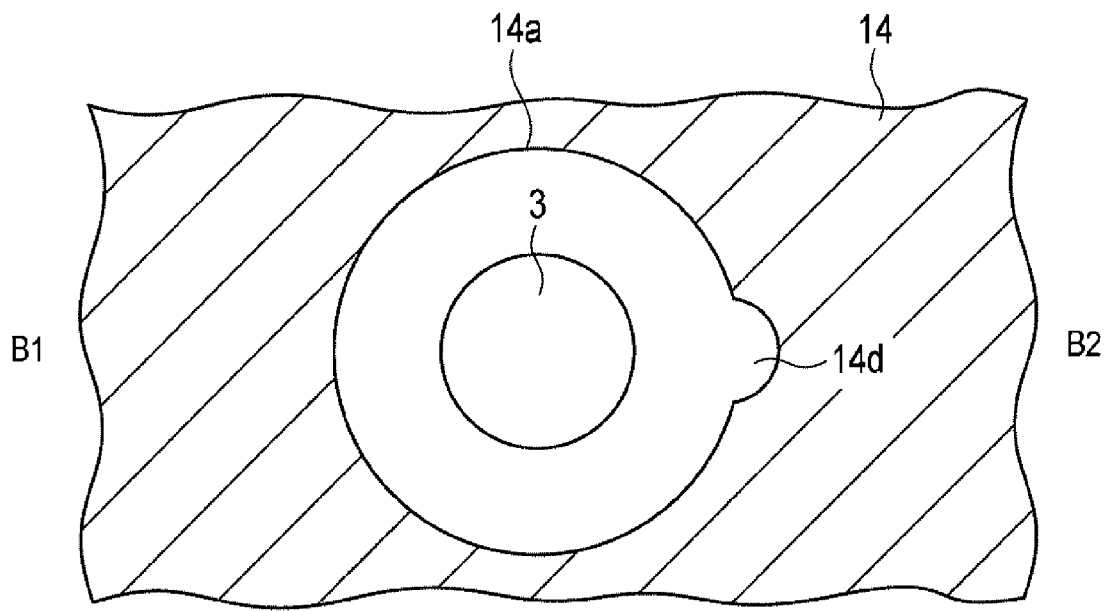

(2) As shown in FIGS. 8A and 8B, the braze pool space 14d is formed in a part of the circumference of the hole 14a in the ceramic member 14 by use of a drill or the like. In this respect, the braze pool space 14d may be formed at the same time as the hole 14a is formed.

Figure 9A:
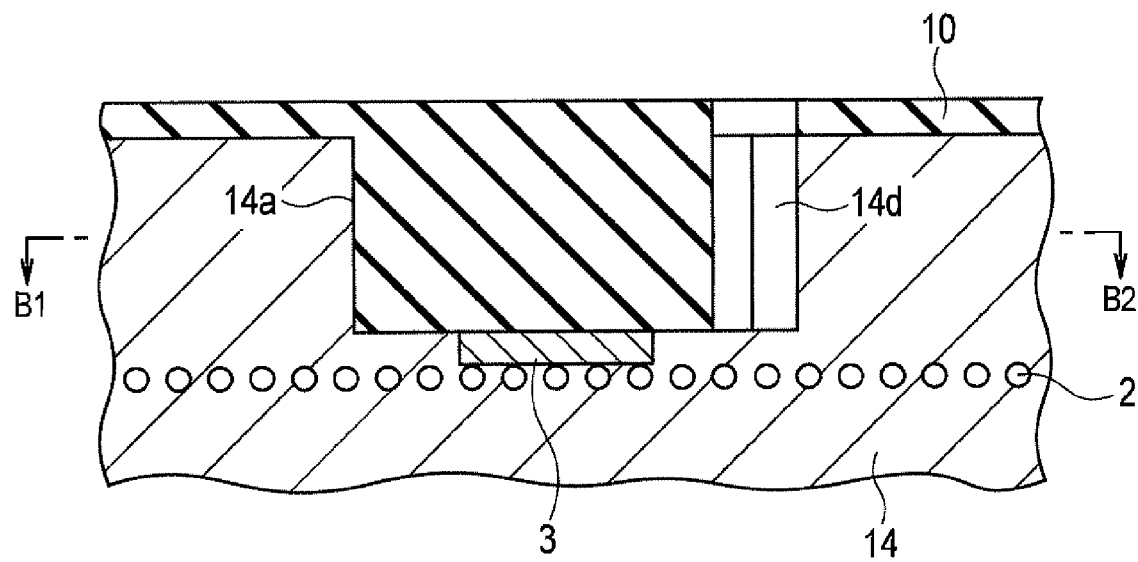
FIGS. 9A and 9B shows a process of manufacturing the semiconductor wafer susceptor according to the second embodiment.
Figure 9B:
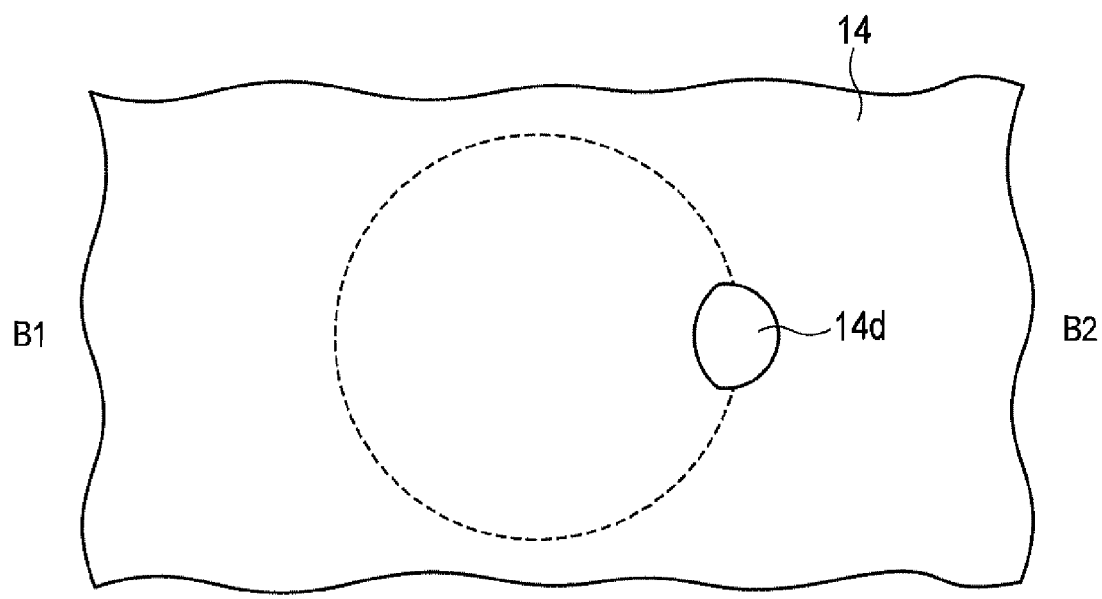

(3) Subsequently, as shown in FIGS. 9A and 9B, a sealing member 10 is arranged on the ceramic member 14 excluding on the braze pool space 14d. Thereafter, a metallizing treatment is applied to the ceramic member 14. The metallizing treatment makes it easier for the melted braze material to fill in the braze pool space 14d. However, the metallizing treatment is not necessarily required. The surface of the connecting member 5 is preferably subjected to an oxidation treatment, except for a part of the surface to be filled with the braze material constituting the brazed bond layer 6. The surface oxidation treatment prevents the braze material from being applied on the surface of the connecting member 5, so that the braze material does not fill the entire clearance. Instead of the oxidation treatment, a material with a poor wettability may be applied to the surface of the connecting member 5. With at least one of the metallizing treatment on the ceramic member 14 and the oxidation treatment on the surface of the connecting member 5, the braze material can be filled only in the braze pool space 14d.

(4) As shown in FIG. 10, the brazed bond layer 6 is arranged in the first space 14c that is formed on the main surface (exposed surface) of the terminal, in the order of the first tantalum layer 6a, the gold layer 6b and the second tantalum layer 6c. Subsequently, the connecting member 5 is arranged in the hole 14a in the ceramic member 14 with the brazed bond layer 6 interposed between the base of the hole 14a and the connecting member 5. Thereafter, the first space 14c, which is defined between the connecting member 5 and the base of the hole 14a including the first main surface of the terminal 3, is filled with the braze material constituting the brazed bond layer 6. Then, the brazed bond layer 6 thus formed is heated and thus melted. With regard to the heating temperature, it is desirable that the brazed bond layer 6 should be heated up to a temperature approximately 20° C. higher than the melting point of gold. The brazed bond layer 6 is left heated at the temperature for approximately 5 minutes after making sure that the braze material constituting the brazed bond layer 6 is melted.

(5) Then, the braze material constituting a part of the brazed bond layer 6 creeps up on the side surface of the connecting member 5 and on the side surface of the braze pool space 14d. Thereby, the surface of the brazed bond layer 6 gradually rises, so that the braze pool space 14d is filled with the brazed bond layer 6. Subsequently, the heating process is terminated, and the brazed bond layer 6 is left to be cooled down naturally. Thereby, the connecting member 5 is bonded to the terminal 3 with the brazed bond layer 6 interposed in between. Through these steps, the semiconductor wafer susceptor 11 shown in FIGS. 5A and 5B is produced.

According to the second embodiment, intermetallic compound is not produced between the connecting member 5 that supplies the electric power to the terminal 3 from the outside and the terminal 3 embedded in the ceramic member 4, or between the terminal 3 and the metal member into which a screw fits. Furthermore, the second embodiment can provide a bonding structure that is reliable even when an external screw is fitted into and removed from the connecting member 5, and that can be reliably used even at a high temperature, and a semiconductor device manufacturing apparatus having this structure.

MODIFIED EXAMPLES

Semiconductor Wafer Susceptor (Bonding Structure)

For the purpose of causing the semiconductor wafer susceptor to have an increased torsional breaking strength, the semiconductor wafer susceptor may have any one of the following structures.

First Modified Example

Figure 11A:
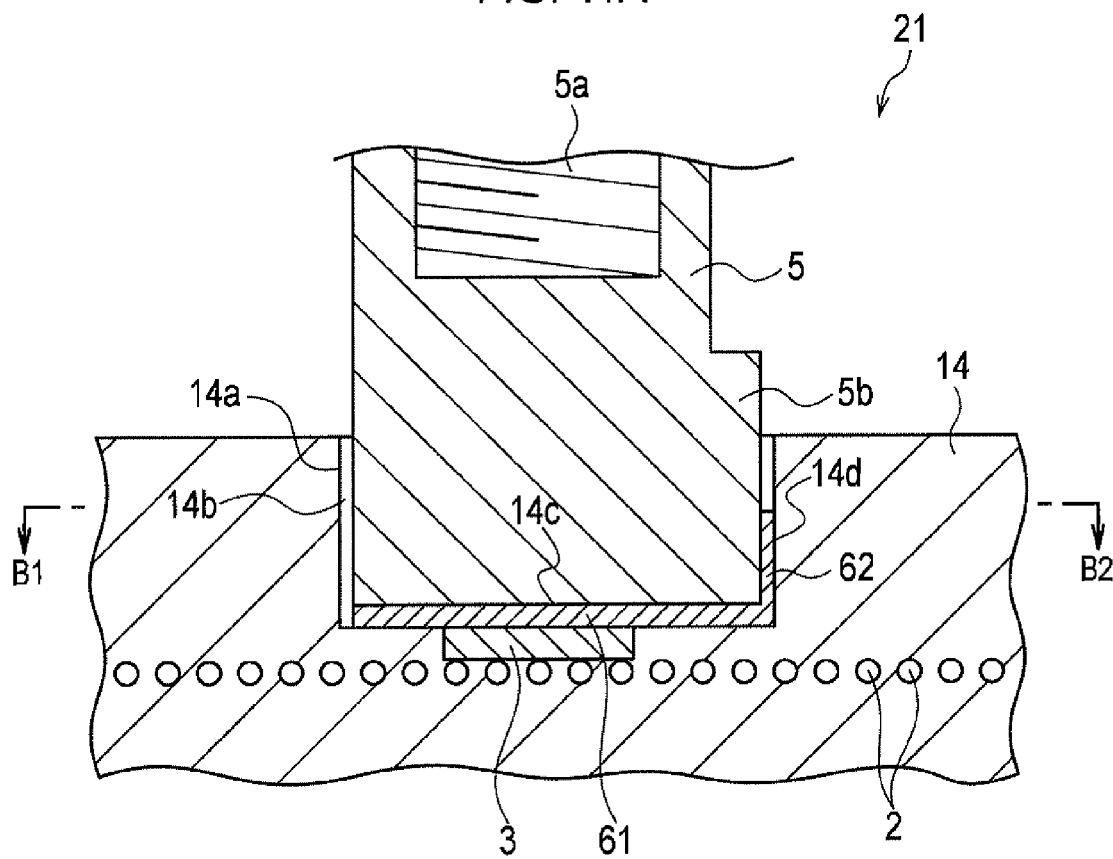
FIG. 11A is a schematic, cross-sectional view of a semiconductor wafer susceptor according to the first modified example, which is vertical to a main surface of a ceramic member included in the semiconductor wafer susceptor.
Figure 11B:
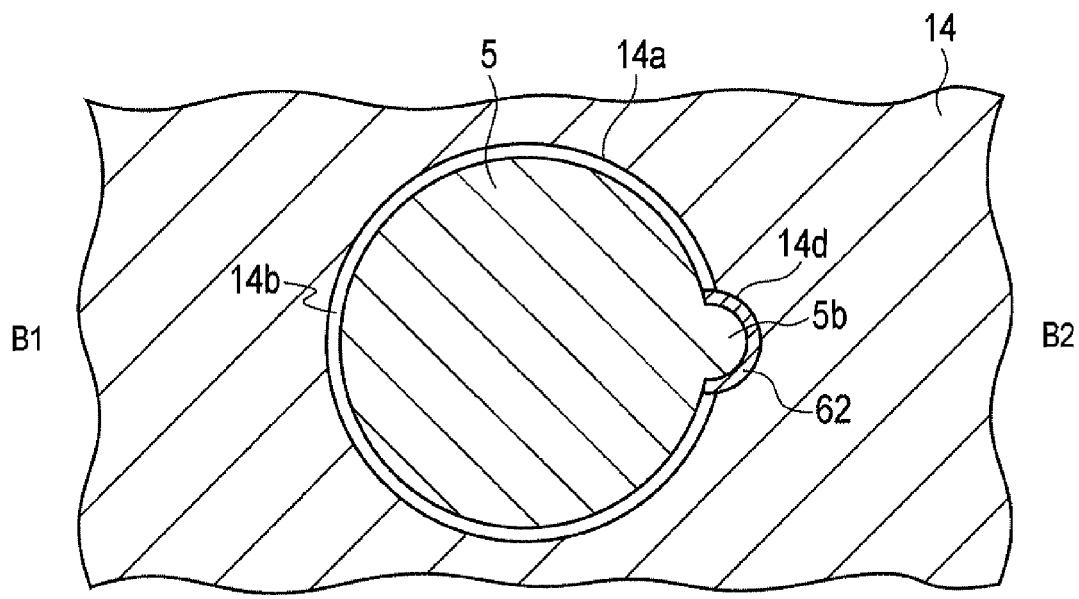
FIG. 11B is a schematic, cross-sectional view of the semiconductor wafer susceptor according to the first modified example, which is parallel with the main surface of the ceramic member included in the semiconductor wafer susceptor.

A semiconductor wafer susceptor may be configured as follows: A braze pool space 14d is formed in a part of the surface of the hole 14a in the ceramic member 14, as shown in FIG. 11B. The braze pool space 14d has a substantially semicircular shape in a cross-sectional plane parallel with the main surface of the ceramic member 14. A protruded portion 5b having a substantially semicircular shape in the cross-sectional plane of the connecting member 5 may be formed in a part of a circumferential surface of the connecting member 5. The braze material 62 may be configured to fill the part of the brazed bond space 14d continuously with the first space 14c. The protruded portion 5b and the braze pool space 14d, which fit with each other forms a locking portion. Accordingly, the torsional breaking strength can be enhanced.

Second Modified Example

Figure 12A:
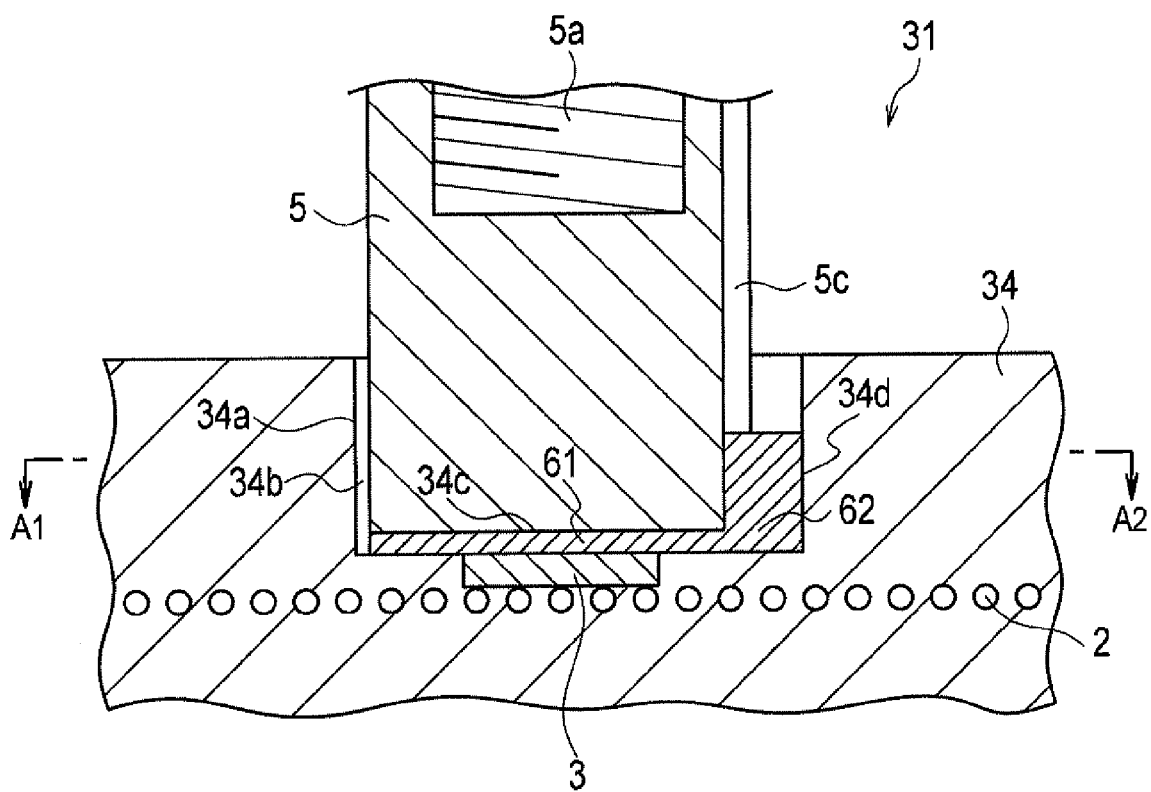
FIG. 12A is a schematic, cross-sectional view of a semiconductor wafer susceptor according to the second modified example, which is vertical to a main surface of a ceramic member included in the semiconductor wafer susceptor.
Figure 12B:
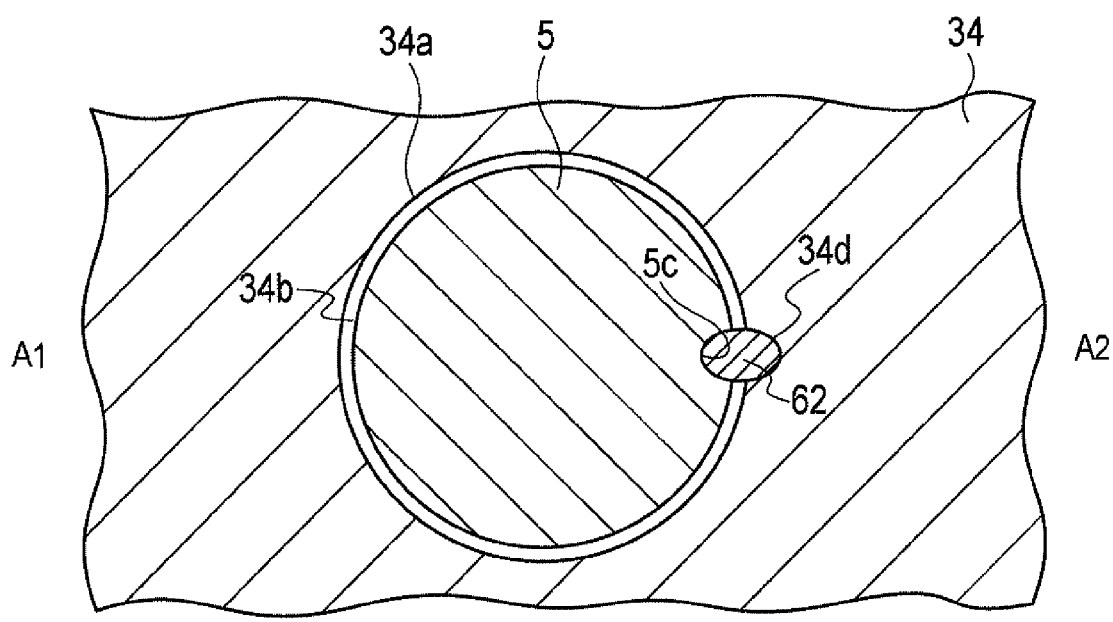
FIG. 12B is a schematic, cross-sectional view of the semiconductor wafer susceptor according to the second modified example, which is parallel with the main surface of the ceramic member included in the semiconductor wafer susceptor.

As shown in FIGS. 12A and 12B, a semiconductor wafer susceptor may be configured as follows: The connecting member 5 has a recessed portion 5c recessing inwardly from a part of the circumferential surface of the connecting member 5. The recessed portion 5c may be partially filled with the braze material 62 constituting a part of the brazed bond layer 61, by extending from the first space 34c when the connecting member 5 is inserted in the ceramic member 34.

Third Modified Example

Figure 13A:
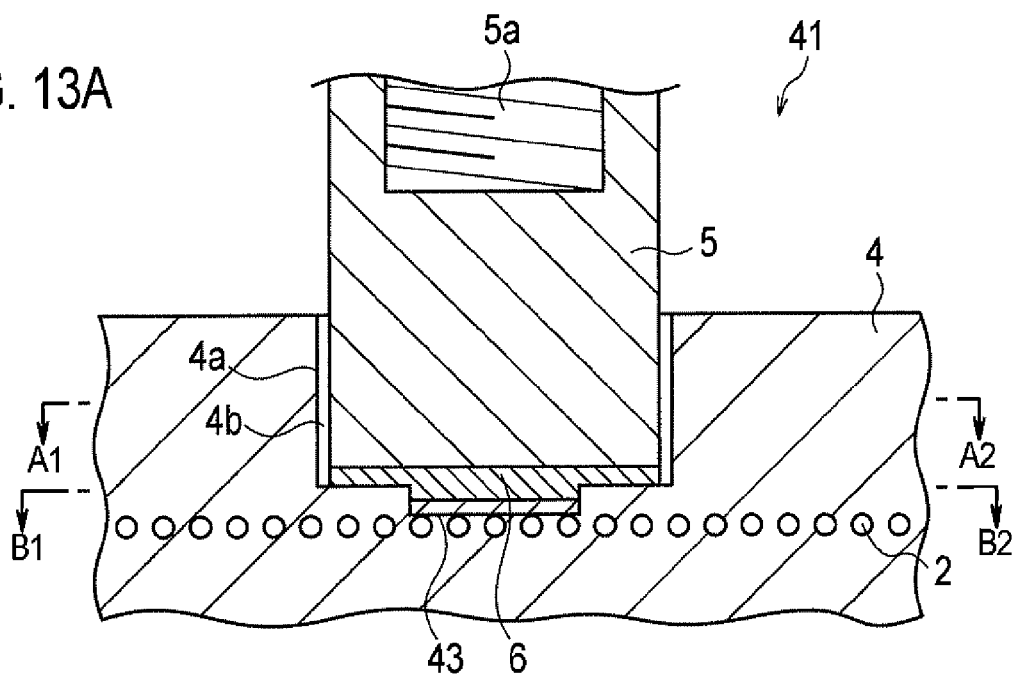
FIG. 13A is a schematic, cross-sectional view of a semiconductor wafer susceptor according to the third modified example, which is vertical to a main surface of a ceramic member included in the semiconductor wafer susceptor.
Figure 13B:
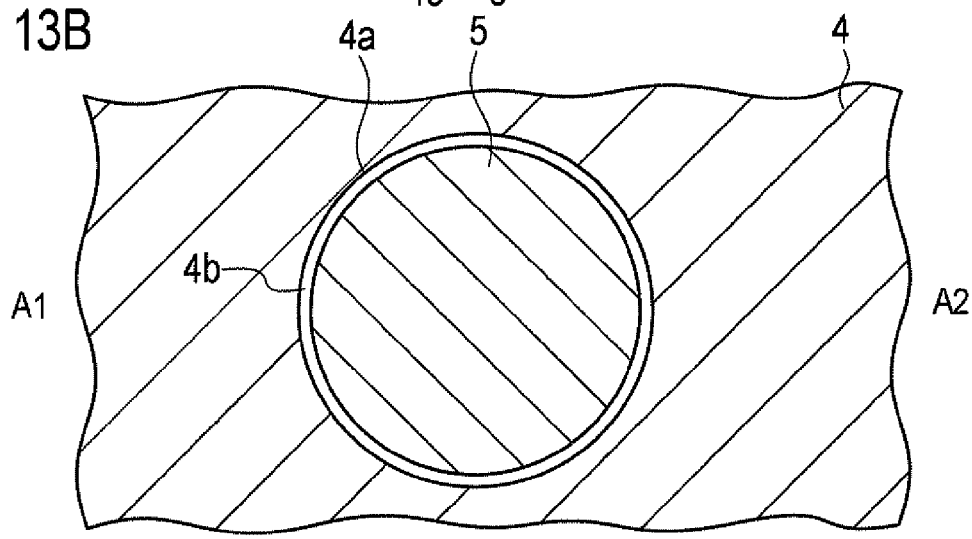
FIG. 13B is a schematic, A1-A2 cross-sectional view of the semiconductor wafer susceptor according to the third modified example, which is parallel with the main surface of the ceramic member included in the semiconductor wafer susceptor according to the third modified example.
Figure 13C:
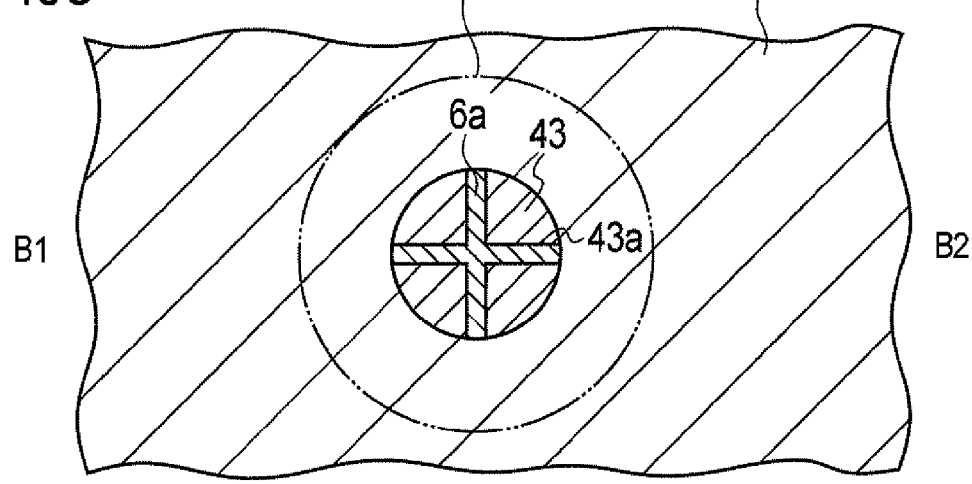
FIG. 13C is a schematic, B1-B2 cross-sectional view of the semiconductor wafer susceptor according to the third modified example, which is parallel with the main surface of the ceramic member included in the semiconductor wafer susceptor according to the third modified example.

As shown in FIG. 13C, a semiconductor wafer susceptor may be configured as follows: A groove 43a may be formed on the first main surface of a terminal 43 so as to be formed into a cross. When the braze material fills the groove 43a, the grove 43a serves as an anchor. Accordingly, an anchor effect can be achieved, and thereby the torsional breaking strength is enhanced.

MODIFIED EXAMPLES

Although the foregoing descriptions have been provided for the present invention by citing embodiments 1 and 2, descriptions and drawings constituting part of this disclosure shall not be construed as imposing limitations on the present invention. From this disclosure, various alternative embodiments, examples and operating techniques will be clear to those skilled in this art. Specifically, this disclosure provides a semiconductor device manufacturing apparatus using the susceptor according to any one of embodiments 1 and 2. As demonstrated by the susceptor according to any one of embodiments 1 and 2, this disclosure provides a reliable bonding structure which causes no intermetallic compound between the terminal embedded in the ceramic member and the connecting member for supplying electric power to the terminal from the outside. It goes without saying that, as described above, the present invention includes various embodiments and the like which have not been described herein. Accordingly, the technical scope of the present invention shall be defined by only invention defining matters concerning the scope of claims which is determined as being adequate on the basis of the foregoing descriptions.

EXAMPLES

Measurement of Bonding Strength

Figure 14:
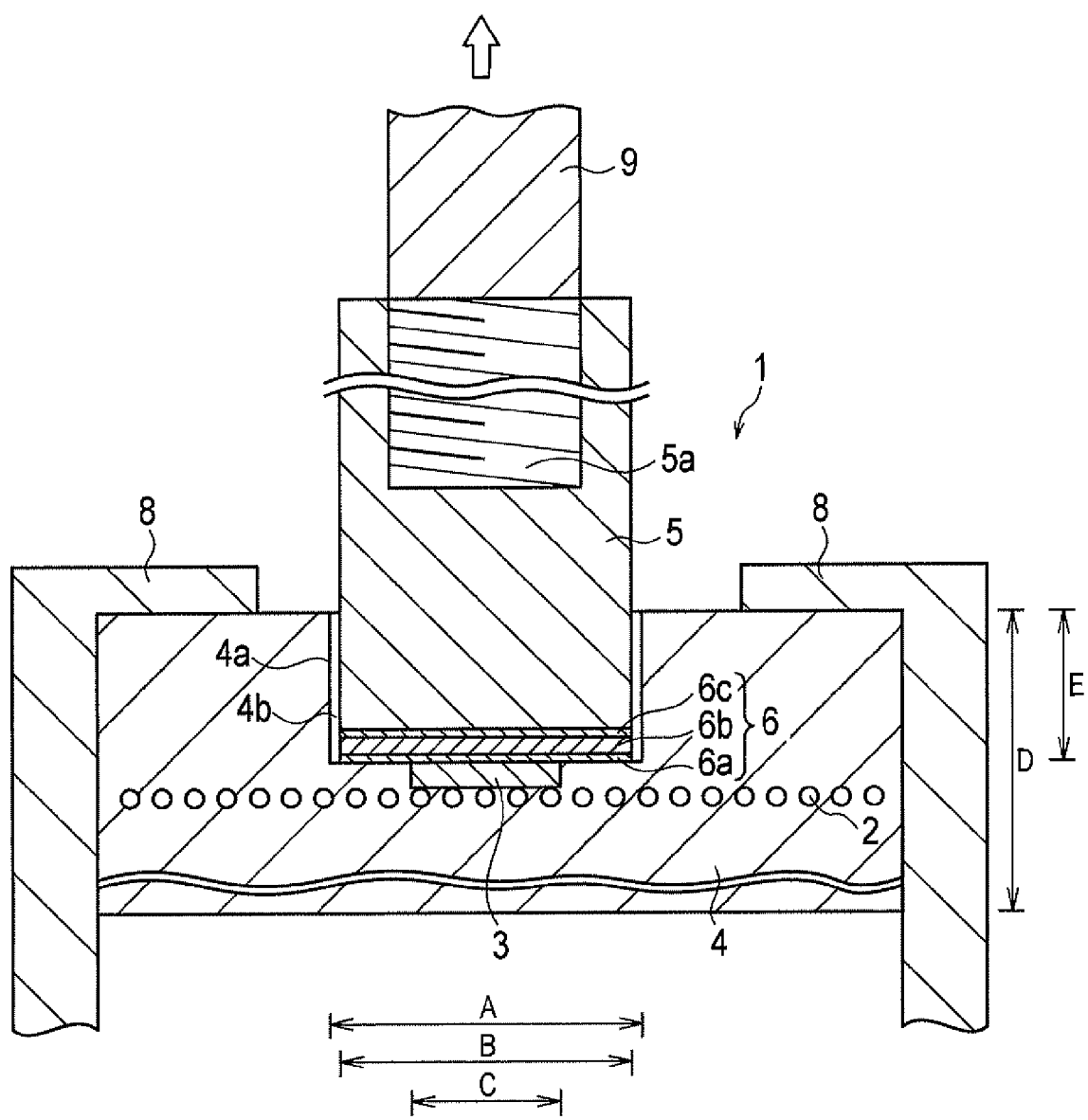
FIG. 14 is a drawing showing a concept with which the bonding strength of a bonding structure of a semiconductor wafer susceptor is measured.

Multiple test-piece ceramic members 4 each made of aluminum nitride were prepared. As shown in FIG. 14, each test-piece ceramic member 4 included: a hole 4a with a diameter A of any one of 4.1 mm, 5.1 mm and 6.1 mm, as well as with a depth E of 4 mm; and a terminal 3 with a diameter C of 3 mm, and with a thickness of 0.5 mm. The thickness D of each test-piece ceramic member 4 was 5 mm. In addition, multiple test-piece connecting members 5 each made of molybdenum were prepared. As shown in FIG. 14, the outer diameter B of each test-piece connecting member 5 was any one of 4 mm, 5 mm and 6 mm. In addition, a groove 5a was formed in each test-piece connecting member 5.

In accordance with conditions shown in Table 1, a brazed bond layer 6 was arranged inside the hole 4a of each test-piece ceramic member 4, and subsequently a test-piece connecting member 5 was arranged on the brazed bond layer 6. In this respect, the diameter B of the test-piece connecting member 5 was equal to the diameter of the brazed bond layer 6. Thereafter, the test-piece connecting member 5 and the test-piece ceramic member 4 with the brazed bond layer 6 being interposed in between were heated to a temperature approximately 20° C. higher than the melting point of gold. After making sure that the brazed bond layer 6 was melted, the test-piece connecting member 5 and the ceramic member 4 with the brazed bond layer 6 being interposed in between were left heated at the temperature for 5 minutes, and then were left to be cooled down naturally.

Through the above-described steps, the connecting member 5 and the ceramic member 4 were bonded together via the brazed bond layer 6. Thereby, the bonding structure including the three-layered brazed bond layer 6 as shown in FIGS. 1A and 1B was obtained. The three layers were the first tantalum (Ta) layer 6a, the gold (Au) layer 6b and the second tantalum (Ta) layer 6c, which are laminated in this order on the surface of the terminal 3.

Thereafter, the resultant test-piece ceramic member 4 was held by a fixture 8 shown in FIG. 14. Subsequently, a load was applied to the test-piece ceramic member 4 in the vertical direction upwardly as indicated by an arrow in FIG. 14, by use of a pulling member 9 screwed in the groove 5a formed in the test-piece connecting member 5. Then, measurements were performed with respect to a bonding strength (unit: kgf) of the bonding structure against the load which the bonding structure withstood when the test-piece connecting member 5 was separated from the ceramic member 4 was measured. The experiment conditions and results are shown in Table 1.

TABLE 1

| | DIAMETER OF CONNECTING MEMBER (mm) | THICKNESS OF gold LAYER (mm) | THICKNESS OF Ta LAYER (mm) | BONDING STRENGTH (KgF) |
|---|---|---|---|---|
| COMPARATIVE EXAMPLE 1 | 4 | 0.05 | 0.01 | 83 |
| EXAMPLE 1 | 4 | 0.1 | 0.01 | 238 |
| EXAMPLE 2 | 4 | 0.15 | 0.01 | 254 |
| EXAMPLE 3 | 4 | 0.2 | 0.01 | 243 |
| COMPARATIVE EXAMPLE 2 | 4 | 0.3 | 0.01 | 92 |
| EXAMPLE 4 | 4 | 0.15 | 0.001 | 230 |
| EXAMPLE 5 | 4 | 0.15 | 0.005 | 240 |
| EXAMPLE 6 | 4 | 0.15 | 0.01 | 254 |
| EXAMPLE 7 | 4 | 0.15 | 0.015 | 249 |
| COMPARATIVE EXAMPLE 3 | 4 | 0.15 | 0.07 | 100 |
| COMPARATIVE EXAMPLE 4 | 5 | 0.05 | 0.01 | 90 |
| EXAMPLE 8 | 5 | 0.1 | 0.01 | 246 |
| EXAMPLE 9 | 5 | 0.15 | 0.01 | 260 |
| EXAMPLE 10 | 5 | 0.2 | 0.01 | 250 |
| COMPARATIVE EXAMPLE 5 | 5 | 0.3 | 0.01 | 95 |
| EXAMPLE 11 | 5 | 0.15 | 0.001 | 239 |
| EXAMPLE 12 | 5 | 0.15 | 0.005 | 248 |
| EXAMPLE 13 | 5 | 0.15 | 0.01 | 260 |
| EXAMPLE 14 | 5 | 0.15 | 0.015 | 253 |
| COMPARATIVE EXAMPLE 6 | 5 | 0.15 | 0.07 | 109 |
| COMPARATIVE EXAMPLE 7 | 6 | 0.05 | 0.01 | 93 |
| EXAMPLE 15 | 6 | 0.1 | 0.01 | 256 |
| EXAMPLE 16 | 6 | 0.15 | 0.01 | 270 |
| EXAMPLE 17 | 6 | 0.2 | 0.01 | 259 |
| COMPARATIVE EXAMPLE 8 | 6 | 0.3 | 0.01 | 98 |
| EXAMPLE 18 | 6 | 0.15 | 0.001 | 248 |
| EXAMPLE 19 | 6 | 0.15 | 0.005 | 258 |

TABLE 1-continued

| | DIAMETER OF CONNECTING MEMBER (mm) | THICKNESS OF gold LAYER (mm) | THICKNESS OF Ta LAYER (mm) | BONDING STRENGTH (KgF) |
|---|---|---|---|---|
| EXAMPLE 20 | 6 | 0.15 | 0.01 | 270 |
| EXAMPLE 21 | 6 | 0.15 | 0.015 | 260 |
| COMPARATIVE EXAMPLE 9 | 6 | 0.15 | 0.07 | 111 |

Examples 1 to 3 and Comparative Examples 1 to 2

Examples 1 to 3 and comparative examples 1 to 2 were checked as to how the thickness of the brazed bond layer 6 with a diameter of 4 mm affected the bonding strength. As a result, it was found that a suitable bonding strength is obtained where the gold (Au) layer is more than 0.05 m but less than 0.3 mm in thickness with the thickness of the tantalum (Ta) layers set at 0.01 mm.

Examples 4 to 7 and Comparative Example 4

Examples 4 to 7 and comparative example 4 were checked as to how the thickness of the brazed bond layer with a diameter of 4 mm affected the bonding strength. As a result, it was found that a suitable bonding strength is obtained where the tantalum (Ta) layers are less than 0.07 mm in thickness with the thickness of the gold (Au) layer set at 0.15 mm.

Examples 8 to 10 and Comparative Examples 4 to 5

Examples 8 to 10 and comparative examples 4 to 5 were checked as to how the thickness of the brazed bond layer with a diameter of 5 mm affected the bonding strength. As a result, it was found that a suitable bonding strength is obtained where the gold (Au) layer is more than 0.05 mm but less than 0.3 mm in thickness with the thickness of the tantalum (Ta) layers set at 0.01 mm.

Examples 11 to 14 and Comparative Example 6

Examples 11 to 14 and comparative example 6 to 5 were checked as to how the thickness of the brazed bond layer with a diameter of 5 mm affected the bonding strength. As a result, it was found that a suitable bonding strength is obtained where the tantalum (Ta) layers are less than 0.07 mm in thickness with the thickness of the gold (Au) layer set at 0.15 mm.

Examples 15 to 17 and Comparative Examples 7 to 8

Examples 15 to 17 and comparative examples 7 to 8 were checked as to how the thickness of the brazed bond layer with a diameter of 6 mm affected the bonding strength. As a result, it was found that a suitable bonding strength is obtained where the gold (Au) layer is more than 0.05 mm but less than 0.3 mm in thickness with the thickness of the tantalum (Ta) layers set at 0.01 mm.

Examples 18 to 21 and Comparative Example 9

Examples 18 to 21 and comparative example 9 were checked as to how the thickness of the brazed bond layer with a diameter of 6 mm affected the bonding strength. As a result, it was found that a suitable bonding strength is obtained where the tantalum (Ta) layers are less than 0.07 mm in thickness with the thickness of the gold (Au) layer set at 0.15 mm.

What is claimed is:

1. A bonding structure, comprising:
   a ceramic member including a hole;
   a terminal embedded in the ceramic member, including an exposed surface exposed to a bottom portion of the hole, and made of a refractory metal having a thermal expansion coefficient substantially equal to a thermal expansion coefficient of the ceramic member;
   a brazed bond layer including a first tantalum layer in contact with the exposed surface of the terminal, a gold layer formed on the first tantalum layer, and a second tantalum layer formed on the gold layer; and
   a connecting member inserted in the hole, bonded to the terminal via the brazed bond layer, and made of a refractory metal having a thermal expansion coefficient substantially equal to the thermal expansion coefficient of the ceramic member.

2. The bonding structure according to claim 1, wherein the ceramic member is made of aluminum nitride, and the refractory metal is molybdenum.

3. The bonding structure according to claim 1, wherein a thickness of the gold layer is more than 0.05 mm but less than 0.3 mm, when a diameter of the brazed bond layer is not less than 4 mm but not more than 6 mm, and when a thickness of both of the first tantalum layer and the second tantalum layer are respectively 0.01 mm.

4. The bonding structure according to claim 1, wherein a thickness of both of first tantalum layer and the second tantalum layer is not less than 0.01 mm but less than 0.07 mm, respectively, when a diameter of the brazed bond layer is not less than 4 mm but not more than 6 mm, and when a thickness of the gold layer is 0.15 mm.

5. The bonding structure according to claim 1, wherein a braze pool space is formed in a part of a side surface of the hole,
   the braze pool space has a substantially semicircular shape in a cross-sectional plane in parallel with a main surface of the ceramic member, and
   the braze pool space is partially filled with a braze material.

6. The bonding structure according to claim 5, wherein the connecting member includes a protruded portion having a substantially semicircular shape in the cross-sectional plane, and the braze pool space and the protruded portion forms a locking portion.

7. The bonding structure according to claim 5, wherein the connecting member includes a recessed portion on a circumferential surface of the connecting member, and the recessed portion is partially filled with a braze material.

8. The bonding structure according to claim 1, wherein a groove filled with a braze material formed on the exposed surface of the terminal, and the braze material filling the groove serves as an anchor.

9. The bonding structure according to claim 5, wherein the number of braze pool spaces formed in the surface of the hole is two to four.

10. The bonding structure according to claim 9, wherein one pair or two pairs of the braze pool spaces are formed at a mutually-opposed location in the surface of the hole.

11. A semiconductor device manufacturing apparatus comprising the bonding structure according to claim 1.

* * * * *